US010087552B2

United States Patent
Koshiro et al.

(10) Patent No.: US 10,087,552 B2
(45) Date of Patent: Oct. 2, 2018

(54) SUBSTRATE FOR EPITAXIAL GROWTH, MANUFACTURING METHOD THEREFOR, AND SUBSTRATE FOR SUPERCONDUCTING WIRE

(71) Applicants: Toyo Kohan Co., Ltd., Tokyo (JP); Sumitomo Electric Industries, Ltd., Osaka (JP)

(72) Inventors: Takashi Koshiro, Yamaguchi (JP); Hironao Okayama, Yamaguchi (JP); Teppei Kurokawa, Yamaguchi (JP); Kouji Nanbu, Yamaguchi (JP)

(73) Assignees: Toyo Kohan Co., Ltd., Tokyo (JP); Sumitomo Electric Industries, Ltd., Osaka (JP)

( * ) Notice: Subject to any disclaimer, the term of this patent is extended or adjusted under 35 U.S.C. 154(b) by 391 days.

(21) Appl. No.: 14/432,827

(22) PCT Filed: Aug. 23, 2013

(86) PCT No.: PCT/JP2013/072520
§ 371 (c)(1),
(2) Date: Apr. 1, 2015

(87) PCT Pub. No.: WO2014/054351
PCT Pub. Date: Apr. 10, 2014

(65) Prior Publication Data
US 2015/0299899 A1 Oct. 22, 2015

(30) Foreign Application Priority Data
Oct. 5, 2012 (JP) .................................. 2012-223187

(51) Int. Cl.
C22F 1/08 (2006.01)
C30B 29/22 (2006.01)
(Continued)

(52) U.S. Cl.
CPC ................ C30B 29/22 (2013.01); C22C 9/00 (2013.01); C22C 9/02 (2013.01); C22C 9/04 (2013.01);
(Continued)

(58) Field of Classification Search
CPC ........ C22F 1/08; H01L 39/2454; H01L 39/12; H01L 39/24; C30B 29/52; C30B 33/02;
(Continued)

(56) References Cited

U.S. PATENT DOCUMENTS 7,927,715 B2 * 4/2011 Kashima ............... B32B 15/015
428/674
2008/0261072 A1 10/2008 Kashima et al.
(Continued)

FOREIGN PATENT DOCUMENTS

JP 2008-266686 11/2008
JP 2010-118246 5/2010

OTHER PUBLICATIONS

Tokudome et al., "Fabrication of YBa2Cu3O7 thin film on cube-textured Cu tape", Journal of Applied Physics, vol. 104, 2008, pp. 103913-1 to 103913-6.*
(Continued)

Primary Examiner — Jonathan C Langman
(74) Attorney, Agent, or Firm — McCarter & English, LLP

(57) ABSTRACT

An objective of the present invention is to provide a copper substrate for epitaxial growth, which has higher biaxial crystal orientation, and a method for manufacturing the same. The substrate for epitaxial growth of the present invention contains a biaxially crystal-oriented copper layer, wherein the full width at half maximum Δφ of a peak based on the pole figure of the copper layer is within 5° and the tail width Δβ of the peak based on the pole figure is within 15°
(Continued)

Such a substrate for epitaxial growth is manufactured by a 1$^{st}$ step of performing heat treatment of a copper layer so that $\Delta\phi$ is within 6° and the tail width $\Delta\beta$ is within 25°, and after the 1$^{st}$ step, a 2$^{nd}$ step of performing heat treatment of the copper layer at a temperature higher than the temperature for heat treatment in the 1$^{st}$ step, so that $\Delta\phi$ is within 5° and the tail width $\Delta\beta$ is within 15°.

6 Claims, 2 Drawing Sheets

(51) Int. Cl.
| | | |
|---|---|---|
| *H01L 39/24* | (2006.01) | |
| *C30B 29/52* | (2006.01) | |
| *C30B 33/02* | (2006.01) | |
| *C22C 9/00* | (2006.01) | |
| *C22C 9/02* | (2006.01) | |
| *C22C 9/04* | (2006.01) | |
| *C30B 1/04* | (2006.01) | |
| *C30B 23/02* | (2006.01) | |
| *C30B 25/18* | (2006.01) | |
| *H01B 12/06* | (2006.01) | |
| *H01B 13/00* | (2006.01) | |
| *H01L 39/12* | (2006.01) | |

(52) U.S. Cl.
CPC ............... *C22F 1/08* (2013.01); *C30B 1/04* (2013.01); *C30B 23/025* (2013.01); *C30B 25/183* (2013.01); *C30B 29/52* (2013.01); *C30B 33/02* (2013.01); *H01B 12/06* (2013.01); *H01B 13/0016* (2013.01); *H01L 39/12* (2013.01); *H01L 39/24* (2013.01); *H01L 39/2454* (2013.01)

(58) Field of Classification Search
CPC ...... C30B 29/22; C30B 25/183; C30B 23/025; C30B 1/04; C22C 9/00; C22C 9/02; C22C 9/04; H01B 12/06; H01B 13/0016
See application file for complete search history.

(56) References Cited

U.S. PATENT DOCUMENTS

2008/0305322 A1* 12/2008 Doi .................. C30B 25/18
428/334
2012/0040840 A1* 2/2012 Okayama ............ H01L 39/2454
505/230

OTHER PUBLICATIONS

Varanasi et al., "Biaxially textured copper and copper-iron alloy substrates for use in YBa2Cu3O7-x", Supercond. Sci. Technol. vol. 19, 2006, pp. 85-95.*

* cited by examiner

SUBSTRATE FOR EPITAXIAL GROWTH, MANUFACTURING METHOD THEREFOR, AND SUBSTRATE FOR SUPERCONDUCTING WIRE

CROSS-REFERENCE TO RELATED APPLICATIONS

This application is a national stage application filed under 35 USC 371 of PCT/JP2013/072520, filed Aug. 23, 2013, which claims the benefit of Japanese Patent Application No. 2012-223187, filed Oct. 5, 2012, all of which are incorporated herein, in entirety, by reference.

TECHNICAL FIELD

The present invention relates to a substrate for epitaxial growth and a method for manufacturing the same. The present invention further relates to a substrate for a superconducting wire, which is manufactured using the substrate for epitaxial growth.

BACKGROUND ART

An excellent high-temperature oxide superconducting wire is conventionally manufactured by epitaxially growing a layer of an oxide such as cerium oxide ($CeO_2$), yttria-stabilized zirconia (YSZ), or yttrium oxide ($Y_2O_3$), as an intermediate layer, on a metal substrate by a sputtering method or the like, and then epitaxially growing a superconducting compound layer (RE123 film, RE: Y, Gd, Ho, or the like) thereon by a laser ablation method or the like.

Methods known as techniques for obtaining a crystal-oriented superconducting compound layer are: an ion-beam-assisted deposition method (IBAD method) that involves depositing a textured intermediate layer on a non-textured metal substrate such as hastelloy, so as to transfer the crystal orientation to a superconducting compound layer; and a method (e.g., RABiTS (Rolling-Assisted Biaxially Textured Substrate) method) that involves performing deposition while transferring the crystal orientation to an intermediate layer and to a superconducting compound layer with the use of a biaxially crystal-oriented metal substrate. The latter method is more advantageous than the former in view of future production efficiency factors such as film deposition rate. High biaxial crystal orientation of a metal substrate is required for improvement of superconductivity.

A substrate known as such a metal substrate (substrate for a superconducting wire) is produced by laminating crystal-oriented copper on a stainless substrate, and then further laminating nickel thereon. For example, Patent Document 1 discloses a clad textured metal substrate for forming an epitaxial thin film comprising a metal layer and a copper layer bonded to at least one surface of the metal layer. The copper layer has a {100} <001> cube texture wherein the drift angle of the crystal axis is $\Delta\phi \leq 6°$.

Furthermore, as a method for manufacturing a biaxially crystal-oriented metal substrate, Patent Document 2 discloses a method for manufacturing a metal laminated substrate for an oxide superconducting wire, which comprises laminating a nonmagnetic metal plate made of stainless steel or the like and a metallic foil made of Cu or a Cu alloy, which has been cold-rolled at a high reduction, through surface activation bonding, biaxially crystal-orienting the metallic foil by heat treatment after lamination, and thus providing an Ni or Ni alloy epitaxial growth film on the surface of the metallic foil.

PRIOR ART DOCUMENTS

Patent Documents

Patent Document 1: JP Patent Publication (Kokai) No. 2008-266686 A
Patent Document 2: JP Patent Publication (Kokai) No. 2010-118246 A

SUMMARY OF THE INVENTION

Problem to be Solved by the Invention

As described above, a conventional substrate for epitaxial growth is manufactured by performing heat treatment of copper that has been cold-rolled at a high reduction, so as to perform crystal-orienting. In particular, a method that involves performing heat treatment at a high temperature, so that copper is highly crystal-oriented is known. However, the use of a continuous heat treating furnace to increase manufacturing efficiency is problematic in that it does not allow crystal orientation to be sufficiently improved. Other problems are that increasing the temperature and the time for annealing causes deterioration of the surface roughness of a copper surface, and that employing heat treatment conditions leading to a smooth copper layer causes deterioration of the surface roughness of a nickel layer when a nickel layer is provided on the copper layer, for example.

An objective of the present invention is to provide a copper substrate for epitaxial growth having a higher biaxial crystal orientation, and a manufacturing method therefor.

Means for Solving the Problem

As a result of intensive studies to achieve the above objective, the present inventors have discovered that controlling the peak shape based on a pole figure obtained by the X-ray diffraction of a copper layer within a predetermined range enables the following to be obtained: the optimum biaxial crystal orientation of the copper layer; and optimum biaxial crystal orientation and surface smoothness of a protective layer (such as a nickel layer) provided on the copper layer. Thus the present inventors have completed the invention. Moreover, the present inventors have discovered that upon manufacturing a substrate, a copper layer having the above optimum biaxial crystal orientation can be obtained by performing 2-stage heat treatment for such copper layer, and thus have completed the invention. Specifically, the present invention is as summarized as follows.

(1) A substrate for epitaxial growth, containing a biaxially crystal-oriented copper layer, wherein the full width at half maximum $\Delta\phi$ of a peak based on the pole figure of the copper layer is within 5°, and the tail width $\Delta\beta$ of the peak based on the pole figure is within 15°.

(2) The substrate for epitaxial growth according to (1) above, further comprising a protective layer containing nickel or a nickel alloy on the copper layer, wherein the protective layer has a thickness of 1 μm or more and 5 μm or less, the full width at half maximum $\Delta\phi$ of a peak based on the pole figure of the protective layer is within 6°, and the surface roughness Ra is 20 nm or less.

(3) A method for manufacturing the substrate for epitaxial growth according to (1) above, comprising a $1^{st}$ step of performing heat treatment of a copper layer so that $\Delta\phi$ is within 6° and the tail width $\Delta\beta$ is within 25°, and a $2^{nd}$ step of performing heat treatment of the copper layer after the $1^{st}$ step at a temperature higher than the temperature for heat treatment in the $1^{st}$ step, so that $\Delta\phi$ is within 5° and the tail width $\Delta\beta$ is within 15°.

(4) A substrate for a superconducting wire, comprising the substrate for epitaxial growth according to (1) or (2) above laminated on a nonmagnetic metal plate.

In addition, in the present invention, the term "substrate for epitaxial growth" refers to a substrate onto which another layer is to be provided by being epitaxially grown on the substrate. Also the term "peak based on the pole figure" refers to a peak obtained by averaging 4 peaks that appear at $\alpha$=350 of the pole figure (111) prepared by X-ray diffraction.

Effect of the Invention

The substrate for epitaxial growth of the present invention is specified in that the full width at half maximum $\Delta\phi$ of a peak based on the pole figure of a copper layer is within 5°, and the tail width $\Delta\beta$ is within 15°. Therefore, the high biaxial crystal orientation and surface smoothness of a copper layer and a protective layer of nickel or the like that is provided on the copper layer can be obtained. Furthermore, heat treatment of a copper layer is performed separately in 2 stages, making it possible to manufacture a substrate for epitaxial growth having the above high biaxial crystal orientation and surface smoothness.

MODES FOR CARRYING OUT THE INVENTION

Hereinafter, the present invention will be described in more detail.

Figure 1:
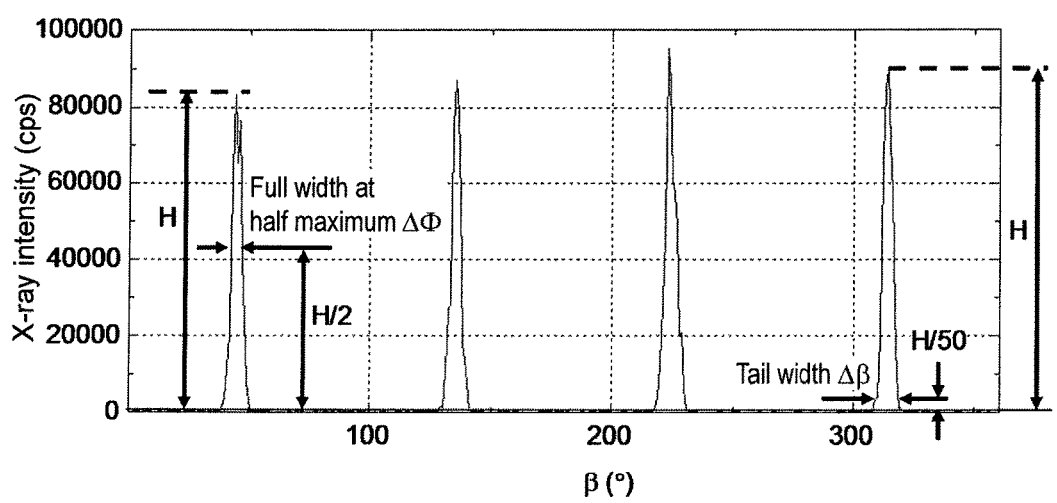
FIG. 1 shows a developed view of $\beta$ angle and X-ray intensity at $\alpha$=35° of a Cu (111) pole figure in example 1.

The substrate for epitaxial growth of the present invention contains a biaxially crystal-oriented copper layer, which is characterized in that the full width at half maximum $\Delta\phi$ of a peak based on the pole figure of the copper layer is within 5°, and preferably within 4.5°, and the tail width $\Delta\beta$ is within 15°. Here, the term "full width at half maximum $\Delta\phi$" in the Cu (111) pole figure obtained by X-ray diffraction refers to, as shown in FIG. 1, the peak width (°) at a position corresponding to a half (H/2) of the peak height "H" that is an average value of 4 peaks that appear at $\alpha$=35°, and the term "tail width $\Delta\beta$" refers to the peak width (°) at a position corresponding to 1/50 of the peak height.

As such a copper layer, a copper foil is preferably used. The thickness of the copper layer is generally preferably 7 $\mu$m or more and 70 $\mu$m or less in order to ensure the copper layer's own strength and achieve better processability upon the later processing of a superconducting wire.

As a method for controlling $\Delta\phi$ and $\Delta\beta$ obtained from the (111) pole figure of a copper layer within predetermined ranges, so as to obtain high biaxial crystal orientation, for example, a method that involves performing cold rolling at a high reduction of at least 90%, providing uniform distortion for the entire copper layer, and then performing heat treatment for recrystallization can be employed. When a reduction is less than 90%, sufficient biaxial crystal orientation may not be obtained by heat treatment to be performed later. Such a high-reduction rolled copper foil can be generally obtained. Examples thereof include high-reduction rolled copper foil (HA foil (trade name)) manufactured by JX Nippon Mining & Metals Corp. and high-reduction rolled copper foil (HX foil (trade name)) manufactured by Hitachi Cable, Ltd.

In the present invention, heat treatment is preferably performed under different conditions in stages in order to finally obtain a copper layer having a full width at half maximum $\Delta\phi$ of within 5°, and a tail width $\Delta\beta$ of within 15°. Accordingly, a copper layer having high biaxial crystal orientation can be obtained. Moreover, when a protective layer made of nickel or the like is provided on a copper layer, the biaxial crystal orientation and the surface smoothness of the protective layer can be enhanced. Specifically, the method of the present invention preferably comprises a $1^{st}$ step of performing heat treatment so that a copper layer has $\Delta\phi$ of within 6° and a tail width $\Delta\beta$ of within 25°, and a $2^{nd}$ step of performing heat treatment after the $1^{st}$ step, at a temperature higher than that for heat treatment in the $1^{st}$ step, so that $\Delta\phi$ is within 5° and the tail width $\Delta\beta$ is within 15°. In addition, when heat treatment of a copper layer is performed by the $1^{st}$ and the $2^{nd}$ steps, the $2^{nd}$ step may be successively performed without cooling after the $1^{st}$ step. As long as a copper layer having a full width at half maximum $\Delta\phi$ of within 6° and a tail width $\Delta\beta$ of within 25° is obtained after the $1^{st}$ step, cooling to the room temperature may be performed once after the $1^{st}$ step, for example, and then the $2^{nd}$ step of heat treatment may be performed.

Specific conditions for heat treatment in the $1^{st}$ and the $2^{nd}$ steps are not particularly limited, as long as $\Delta\phi$ and $\Delta\beta$ can be controlled within predetermined ranges. As an example, in the $1^{st}$ step, heat treatment is preferably performed at relatively low temperatures (200° C.-400° C.), and the time for heat treatment may range from about 5 to 240 minutes. Furthermore, in the $2^{nd}$ step, the temperature for heat treatment is higher than that of the $1^{st}$ step. However, if the temperature for heat treatment is too high, a copper layer is more likely to undergo secondary recrystallization, and crystal orientation is deteriorated. Hence, the temperature for heat treatment is preferably 1000° C. or lower and more preferably ranges from 800° C. to 900° C. Furthermore, the time for heat treatment in the $2^{nd}$ step differs depending on other conditions, and is preferably a relatively short period of time. Specifically, the time for annealing is less than 10 minutes, and particularly preferably ranges from 1 to 5 minutes. The term "time for annealing" as used herein refers to a period of time during which a copper layer is retained within a furnace wherein the temperature reaches a predetermined temperature. When the time for annealing is 10 minutes or more, a copper layer may be deteriorated in surface roughness, or secondary recrystallization or excessive rearrangement may take place. As a result, a protective layer to be provided on the copper layer may be deteriorated in surface roughness. In addition, the above heat treatment is preferably actually performed in a process of manufacturing a substrate for a superconducting wire, after bonding a copper layer and a nonmagnetic metal plate by a surface activation bonding method or the like. The above heat treatment improves adhesion between a copper layer and a nonmagnetic metal plate, and specifically, adhesion of 10 N/cm or more, and preferably of 20 N/cm or more can be obtained.

Further, a copper layer may contain a slight amount (about 1% or less) of an element in order to further improve biaxial crystal orientation by heat treatment. Examples of such an additional element that can be used herein include one or more types of element selected from among Ag, Sn, Zn, Zr, O, N, and the like. These additional elements and copper form solid solutions. If the amount thereof to be added exceeds 1%, impurities such as oxides other than a solid solution increase. This may adversely affect crystal orientation.

Furthermore, a protective layer containing nickel or a nickel alloy can be formed on a biaxially crystal-oriented copper layer by plating. A nickel-containing protective layer has better oxidation resistance than that of a copper layer. Moreover, because of the presence of a protective layer, when an intermediate layer such as a $CeO_2$ layer is formed thereon, the generation of a copper oxide film and the deterioration of crystal orientation are prevented. An element to be contained in a nickel alloy preferably leads to decreased magnetism, and examples thereof include Cu, Sn, W, and Cr. In addition, impurities may be contained, as long as they do not adversely affect crystal orientation.

When the thickness of a protective layer containing nickel or a nickel alloy is too thin, Cu may diffuse onto the surface of the protective layer, so as to oxidize the surface, when an intermediate layer and a superconducting compound layer are laminated thereon. When the thickness of the same is too thick, the protective layer is deteriorated in crystal orientation, and the plating distortion increases. The thickness of a protective layer is appropriately determined in view of these possibilities, and specifically is preferably 1 μm or more and 5 μm or less.

Also, in the present invention, a copper layer is controlled to have a full width at half maximum $\Delta\phi$ of within 5°, and a tail width $\Delta\beta$ of within 15°, so that the crystal orientation of a protective layer to be provide on the copper layer can be well maintained, and the smoothness of the surface of the protective layer can be more improved. Specifically, a protective layer having a full width at half maximum $\Delta\phi$ of within 6° of a peak based on the pole figure of the protective layer, and a surface roughness Ra of 20 nm or less can be formed.

Plating can be performed under appropriately employed conditions that minimize the plating distortion of a protective layer. Here, the term "plating distortion" refers to the degree of distortion that takes place within a plated film when plating is performed for a substrate such as a metal plate. For example, when a layer made of nickel is formed as a protective layer, this can be performed using a Watts bath or a sulfamate bath conventionally known as a plating bath. In particular, a sulfamate bath tends to minimize the plating distortion of a protective layer and thus is preferably used. The preferable range of the composition of a plating bath is as follows, but the range is not limited thereto.
(Watts Bath)

| | |
|---|---|
| Nickel sulfate | 200-300 g/l |
| Nickel chloride | 30-60 g/l |
| Boric acid | 30-40 g/l |
| pH | 4-5 |
| Bath temperature | 40° C.-60° C. |

(Sulfamate Bath)

| | |
|---|---|
| Nickel sulfamate | 200-600 g/l |
| Nickel chloride | 0-15 g/l |
| Boric acid | 30-40 g/l |

-continued

| Additive | Appropriate quantity |
|---|---|
| pH | 3.5-4.5 |
| Bath temperature | 40° C.-70° C. |

Current density when plating is performed is not particularly limited and is appropriately determined in view of a balance thereof with the time required for plating. Specifically, for example, when a plated film of 2 μm or more is formed as a protective layer, low current density may result in a longer period of time required for plating, decreased line speed to secure the time therefor, lower productivity, and more difficult control of plating. Hence, current density is generally preferably 10 A/dm$^2$ or more. Moreover, the upper limit of current density differs depending on the type of plating bath, and is not particularly limited. For example, current density in the case of Watts bath is preferably 25 A/dm$^2$ or less, and the same in the case of sulfamate bath is preferably 35 A/dm$^2$ or less. In general, when current density exceeds 35 A/dm$^2$, good crystal orientation may not be obtained due to namely the burning of plating.

The thus formed protective layer may undergo the formation of micropits on the surface depending on plating conditions and the like. In such a case, if necessary, the surface can be smoothed by leveling via further heat treatment after plating. The temperatures of heat treatment at this time preferably range from 700° C. to 1000° C., for example.

The above substrate for epitaxial growth having a copper layer and a protective layer and a nonmagnetic metal plate are further laminated, so that a substrate for a superconducting wire can be obtained. When the substrate for a superconducting wire is manufactured, actually preferably, first, a copper layer rolled at a high reduction and a nonmagnetic metal plate are bonded, subsequently predetermined heat treatment is performed, a full width at half maximum $\Delta\phi$ (of a peak based on the pole figure of a copper layer) is controlled to be within 5°, and a tail width $\Delta\beta$ is controlled to be within 15°, so as to improve biaxial crystal orientation, and a protective layer is formed on the copper layer by plating to manufacture the substrate.

The term "nonmagnetic" refers to a state, in which the relevant metal plate is not ferromagnetic at a temperature of 77K or higher, that is, a Curie point or a Neel point thereof exists at a temperature of 77K or below and the same is paramagnetic or antiferromagnetic at a temperature of 77K or higher. As such a nonmagnetic metal plate, a nickel alloy or austenitic stainless steel is preferably used since it has excellent strength and plays a role as a reinforcing material.

In general, although austenitic stainless steel is in a nonmagnetic state at ordinary temperature, that is, in a state where the metal texture is 100% austenite (γ) phase. However, when an (α') phase transformation point (Ms point) of a martensite which is ferromagnetic is positioned at a temperature of 77K or higher, a α' phase which is ferromagnetic at a liquid nitrogen temperature may appear. Accordingly, an austenitic stainless steel plate whose Ms point is designed at a temperature of 77K or below is preferably used as a substrate (for a superconducting wire) to be used at a temperature below a liquid nitrogen temperature (77K).

From such a viewpoint, as a γ-stainless steel plate to be used, it is preferable to use a plate material such as SUS316 or SUS316L, SUS310, SUS305 or the like, which has a stable γ phase with an Ms point designed to be sufficiently lower than 77K, is widely available at a relatively low cost. Such a metal plate generally having a thickness of 20 μm or more is applicable herein. When a thinner superconducting wire and the strength of the same are taken into consideration, it is preferable to set the thickness to 50 μm or more and 100 μm or less. However, the thicknesses are not limited to this range.

The above nonmagnetic metal plate and copper layer can be laminated appropriately using a conventionally known technique such as a surface activation bonding method. In the surface activation bonding method, the surfaces of the nonmagnetic metal plate and the copper layer are each subjected to sputter etching treatment in an extremely-low-pressure inert gas atmosphere of about 10 to $1 \times 10^{-2}$ Pa, for example, so as to remove the surface adsorption layer and the surface oxide film for activation, and then the thus activated two surfaces are bonded by cold bonding at a reduction of 0.1%-5%. Cold bonding is preferably performed under high vacuum of $1 \times 10^{-2}$ Pa or less so as not to adversely affect the adhesion due to re-oxidation of the activated surfaces.

Further, to well maintain the crystal orientation of an intermediate layer and a superconducting compound layer to be further laminated by epitaxial growth onto a protective layer, after bonding of a nonmagnetic metal plate and a copper layer, treatment may be performed to reduce the surface roughness Ra of the copper layer, as necessary. Specifically, methods such as rolling under pressure, buffing, electropolishing, electropolishing using electrolytic abrasive grains, and the like can be employed. With the use of these methods, surface roughness Ra is desired to be 20 nm or less and preferably 10 nm or less, for example.

In addition, a biaxially crystal-oriented copper layer and a protective layer may be laminated onto only one surface of a nonmagnetic metal plate, or laminated onto both surfaces of a metal plate.

An intermediate layer and a superconducting compound layer are laminated in sequence onto a protective layer of the above substrate for a superconducting wire according to a conventional method, so that a superconducting wire can be manufactured. Specifically, an intermediate layer of $CeO_2$, YSZ, $SrTiO_3$, MgO, $Y_2O_3$, or the like is epitaxially deposited using a means such as a sputtering method onto a protective layer formed by plating, and then a Y123-based superconducting compound layer or the like is further deposited thereon by a laser ablation method or the like, and thus a superconducting wire can be obtained. When necessary, a protective film made of Ag, Cu, or the like may further be provided on the superconducting compound layer.

EXAMPLES

The present invention is explained in detail as follows based on examples and comparative examples, but is not limited to these examples.

Examples 1 and 2 and Comparative Examples 1 to 5

First, a copper foil (thickness: 18 μm) that had been cold-rolled at a high reduction (reduction: 96%-99%) was subjected to sputter etching treatment under an Ar gas atmosphere of 0.05 Pa-1 Pa by a surface activation bonding method and then cold-bonded at a reduction of 0.1%-1% to SUS316L (thickness: 100 μm) as a nonmagnetic metal plate, thereby producing a laminated material. The copper layer surface of the laminated material was polished to have a surface roughness Ra of 20 nm or less, and then the laminated material was subjected to heat treatment under the following conditions for each step.

As a $1^{st}$ step, heat treatment (temperature: 250° C.-300° C., time for annealing: 5 minutes) was performed, and then as a $2^{nd}$ step, heat treatment (temperature: 850° C.-875° C., time for annealing: 5 minutes) was performed (examples 1 and 2). In addition, heat treatment was performed using continuous heat treating furnace in both steps.

Heat treatment was performed (temperature: 250° C., time for annealing: 5 minutes and 240 minutes) (corresponding to heat treatment of only the $1^{st}$ step of comparative examples 1 and 2). In addition, heat treatment (the time for annealing: 5 minutes) in comparative example 1 was performed using a continuous heat treating furnace; heat treatment (the time for annealing: 240 minutes) in comparative example 2 was performed using a box-type heat treating furnace with.

Heat treatment was performed (temperature: 850° C.-950° C., time for annealing: 5-10 minutes) (corresponding to heat treatment of only the $2^{nd}$ step of comparative examples 3, 4 and 5). In addition, heat treatment was performed using a continuous heat treating furnace in all cases.

Next, nickel was plated onto the copper layer using the laminated material as a cathode. The composition of a plating bath is as follows. In addition, the plating thickness of nickel was set to 2.5 μm, the plating bath temperature was set at 70° C., and the pH of the plating bath was set at pH 4.

(Sulfamate Bath)

| | |
|---|---|
| Nickel sulfamate | 450 g/l |
| Nickel chloride | 5 g/l |
| Boric acid | 30 g/l |
| Additive | 5 ml/l |

Figure 2:
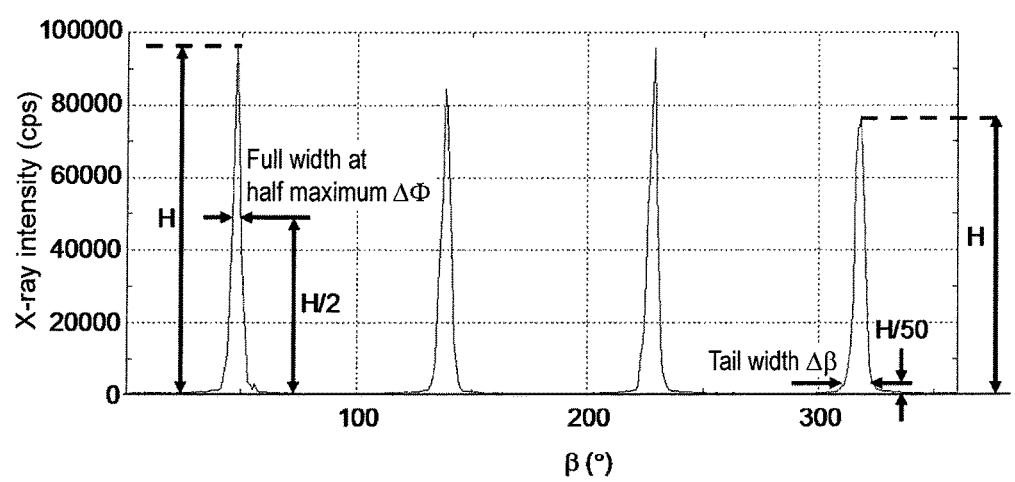
FIG. 2 shows a developed view of 3 angle and X-ray intensity at $\alpha$=350 of a Cu (111) pole figure in comparative example 1.

Furthermore, at the stage of the completion of heat treatment for the copper layer and at the stage of the completion of nickel plating, the full width at half maximum Δϕ and the tail width Δβ of the peaks based on the pole figures of the copper layer and the protective layer were each measured using an X-ray diffractometer (RINT2000 (Rigaku Corporation)). The developed views of β angles and X-ray intensities at α=35° of the pole figures measured in example 1 and comparative example 1 are shown in FIG. 1 and FIG. 2, respectively.

Moreover, arithmetic mean roughness within a 10 μm×10 μm area was measured as the surface roughness Ra of the copper layer and the protective layer using AFM (Nano ScopeIIIaD3000 (Digital Instruments)). Furthermore, adhesion and Cu diffusion length of the SUS316L/copper layer interface were measured. The results are shown in Table 1. In Table 1, each measured value is shown in the form of "A/B", where "A" denotes the average value of the measured values of 5 samples, and "B" denotes the maximum value of the measured values of the above 5 samples. The number of samples subjected to measurement of adhesion was 1 and the same subjected to measurement of Cu diffusion length was 1.

In addition, regarding the adhesion of the SUS316L/copper layer interface, 180° peel strength for a width of 10 mm was measured using a tensile testing machine (TENSILON universal testing machine (A&D Company, Limited)). Also, the Cu diffusion length of the SUS316L/copper layer interface was observed with a transmission electron microscope (TEM, JEM-2010F (JEOL Ltd.,) and measured based on energy dispersive X-ray spectrometry (EDS, UTWSi-Li (Nolan)). The "Cu diffusion length" is defined as the distance from the SUS316 L/copper layer interface to a position at which the copper concentration of 2 at % or more is detected via elementary analysis of the SUS 316L side by EDS.

Furthermore, in Table 1, criteria for "○", "Δ", and "x" are as follows.

(Crystal Orientation)
  ○: Δϕ (average value and maximum value) of the protective layer is within 5°
  Δ: Δϕ (average value and maximum value) of the protective layer is within 5.5°
  x: Δϕ (average value or maximum value) of the protective layer is higher than 5.5° (but within 6°)
(Surface Roughness)
  ○: Ra of the protective layer is within 20 nm
  x: Ra of the protective layer is higher than 20 nm
(Adhesion)
  ○: adhesion is 10 N/cm or more
  x: adhesion is less than 10 N/cm that the formation of a protective layer made of nickel by plating results in the rough surface of the protective layer. Moreover, adhesion between the SUS plate and the copper layer was insufficient.

In comparative example 3, high-temperature treatment alone was performed using a continuous heat treating furnace. In the process of recrystallization (Cu (100) orientation) from rolling texture, crystals deviating from Cu (100) grew, and Δϕ was not decreased. A sharp increase in Cu diffusion length at a heat treatment temperature of around 800° C. is also assumed to be a cause of inhibiting crystal growth.

In comparative examples 4 and 5, the temperature for heat treatment was set at a higher temperature. In comparative example 5, the time for annealing was increased. Therefore, excess rearrangement of crystal took place in the copper layer. It was revealed that this made the surface of the protective layer rough, upon the formation of the protective layer made of nickel by plating. These results revealed that, regarding conditions for the $2^{nd}$ step when heat treatment is performed in stages, the heat treatment temperatures should

TABLE 1

|  | Example 1 | Example 2 | Comparative example 1 | Comparative example 2 |
|---|---|---|---|---|
| Step | $1^{st}$ step→$2^{nd}$ step | $1^{st}$ step→$2^{nd}$ step | $1^{st}$ step | $1^{st}$ step |
| Temperature (° C.) | Low temperature→ High temperature (250 + 850) | Low temperature→ High temperature (300 + 875) | Low temperature (250) | Low temperature (250) |
| Time for annealing (min) | Short time (5 min each) | Short time (5 min each) | Short time (5) | Long time (240) |
| Crystal orientation (XRD) | ○ | ○ | ○ | ○ |
| (CuΔϕ/°) | (4.36/4.48) | (4.60/4.82) | (4.39/4.42) | (4.33/4.45) |
| $1^{st}$ step (Cu Tail width Δβ/°) | (19.14/19.88) | (18.32/19.15) | (19.14/19.88) | (18.32/19.45) |
| $2^{nd}$ step (Cu Tail width Δβ/°) | (14.67/15.30) | (14.32/14.86) | — | — |
| (NiΔϕ/°) | (4.79/4.91) | (4.75/4.96) | (4.17/4.42) | (4.22/4.39) |
| Surface roughness (AFM) | ○ | ○ | x | x |
| (Cu Ra/nm) | (5.97/6.60) | (9.85/13.87) | (5.51/6.36) | (5.33/6.77) |
| (Ni Ra/nm) | (12.22/14.20) | (11.76/12.46) | (52.2/55.5) | (48.9/52.2) |
| Cu/SUS Adhesion | ○ | ○ | x | x |
| Cu diffusion length (nm) | 100 | >100 | <10 | <10 |
| Adhesion (N/cm) | Breaking of material Unmeasurable | Breaking of material Unmeasurable | <3 | <3 |

|  | Comparative example 3 | Comparative example 4 | Comparative example 5 |
|---|---|---|---|
| Step | $2^{nd}$ step | $2^{nd}$ step | $2^{nd}$ step |
| Temperature (° C.) | High temperature (850) | High temperature + α (950) | High temperature + α (950) |
| Time for annealing (min) | Short time (5) | Short time (5) | Short time +α (10) |
| Crystal orientation (XRD) | x | Δ | Δ |
| (CuΔϕ/°) | (4.90/5.11) | (4.82/5.00) | (4.78/4.91) |
| $1^{st}$ step (Cu Tail width Δβ/°) | — | — | — |
| $2^{nd}$ step (Cu Tail width Δβ/°) | (16.11/16.74) | (15.92/16.63) | (16.08/16.82) |
| (NiΔϕ/°) | (5.43/5.70) | (5.23/5.41) | (5.11/5.35) |
| Surface roughness (AFM) | ○ | x | x |
| (Cu Ra/nm) | (5.42/6.47) | (8.30/9.55) | (29.2/34.5) |
| (Ni Ra/nm) | (13.36/15.55) | (27.8/31.2) | (53.8/61.2) |
| Cu/SUS Adhesion | ○ | ○ | ○ |
| Cu diffusion length (nm) | 100 | >120 | >120 |
| Adhesion (N/cm) | Breaking of material Unmeasurable | Breaking of material Unmeasurable | Breaking of material Unmeasurable |

Supplementary notes)
Crystal orientation, Surface roughness . . . N5ave./N5max.

In comparative examples 1 and 2, low-temperature heat treatment (corresponding to heat treatment in the $1^{st}$ step) alone was performed. The Δϕ of the thus obtained copper layer was low and the surface was smooth, however, the orientation within the copper layer was insufficient, such that fine and random crystals were present. It was thus revealed be set to range from 800° C. to 900° C., and the time for annealing should be set to be less than 10 minutes.

In contrast to these comparative examples, in examples 1 and 2, where heat treatment was performed in stages in the $1^{st}$ and the $2^{nd}$ steps, crystals of the copper layer were preferentially Cu (100)-oriented in the $1^{st}$ step, and then crystal rearrangement was caused to take place in the copper layer in the 2$^{nd}$ step. Accordingly, the surface of the protective layer made of nickel was smooth. At this time, within the copper layer, nuclei of Cu (100)-oriented crystal grains were generated in the 1$^{st}$ step, and thus rearrangement was thought to take place in the 2$^{nd}$ step to grow the nuclei generated in the 1$^{st}$ step. Through high crystal orientation of the copper layer in such a manner, the nickel protective layer provided on the upper layer thereof also had high crystal orientation, and the surface became smooth. Furthermore, adhesion between the SUS plate and the copper layer was also excellent.

All publications, patents, and patent applications cited herein are incorporated herein by reference in their entirety.

We claim:

1. A substrate for epitaxial growth, containing a biaxially crystal-oriented copper layer, wherein the full width at half maximum $\Delta\Phi$ of a peak based on the pole figure of the copper layer is within 5°, and the tail width $\Delta\beta$ of the peak based on the pole figure is within 15°.

2. The substrate for epitaxial growth according to claim 1, further comprising a protective layer containing nickel or a nickel alloy on the copper layer, wherein the protective layer has a thickness of 1 μm or more and 5 μm or less, the full width at half maximum $\Delta\Phi$ of a peak based on the pole figure of the protective layer is within 6°, and the surface roughness Ra is 20 nm or less.

3. The substrate for epitaxial growth according to claim 1, further comprising a protective layer containing nickel or a nickel alloy on the copper layer, wherein the protective layer has the full width at half maximum $\Delta\varphi$ of a peak based on the pole figure of the protective layer is within 6°, and the surface roughness Ra is 20 nm or less.

4. A method for manufacturing the substrate for epitaxial growth according to claim 1, comprising a 1st step of performing heat treatment of a copper layer so that $\Delta\Phi$ is within 6° and the tail width $\Delta\beta$ is within 25°, and a 2nd step of performing heat treatment of the copper layer after the 1st step at a temperature higher than the temperature for heat treatment in the 1st step, so that $\Delta\Phi$ is within 5° and the tail width $\Delta\beta$ is within 15°.

5. A substrate for a superconducting wire, comprising the substrate for epitaxial growth according to claim 1 laminated on a nonmagnetic metal plate.

6. A substrate for a superconducting wire, comprising the substrate for epitaxial growth according to claim 2 laminated on a nonmagnetic metal plate.

* * * * *